(12) United States Patent
Jeong

(10) Patent No.: US 7,532,478 B2
(45) Date of Patent: May 12, 2009

(54) PLASMA DISPLAY MODULE

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 11/365,926

(22) Filed: Mar. 2, 2006

(65) Prior Publication Data

US 2006/0227511 A1 Oct. 12, 2006

(30) Foreign Application Priority Data

Apr. 6, 2005 (KR) .................. 10-2005-0028553

(51) Int. Cl.
*H05K 7/20* (2006.01)
(52) U.S. Cl. .............. 361/715; 361/681; 361/704; 361/719; 165/80.3; 313/46
(58) Field of Classification Search ........... 361/704, 361/715, 719, 681; 313/582, 479, 489; 438/166; 165/80.3, 185; 174/16.3; 257/706, 722, 257/E23.084, E23.103
See application file for complete search history.

(56) References Cited

U.S. PATENT DOCUMENTS

| | | | | |
|---|---|---|---|---|
| 4,356,864 A * | 11/1982 | Ariga et al. | ............... | 165/80.3 |
| 5,499,450 A * | 3/1996 | Jacoby | ............... | 29/890.03 |
| 5,701,951 A * | 12/1997 | Jean | ............... | 165/121 |
| 5,971,566 A * | 10/1999 | Tani et al. | ............... | 362/294 |
| 6,077,140 A * | 6/2000 | Kimura et al. | ............... | 445/24 |
| 6,230,789 B1 * | 5/2001 | Pei et al. | ............... | 165/80.3 |
| 6,244,332 B1 * | 6/2001 | Gesklin et al. | ............... | 165/80.3 |
| 6,357,514 B1 * | 3/2002 | Sasaki et al. | ............... | 165/80.3 |
| 6,414,433 B1 * | 7/2002 | Moore | ............... | 313/582 |
| 6,534,722 B2 * | 3/2003 | Takaoka | ............... | 174/254 |
| 6,744,186 B2 * | 6/2004 | Oishi et al. | ............... | 313/46 |
| 6,849,992 B2 * | 2/2005 | Kim et al. | ............... | 313/46 |
| 7,133,281 B2 * | 11/2006 | Bae | ............... | 361/681 |
| 7,167,365 B2 * | 1/2007 | Fu et al. | ............... | 361/697 |

(Continued)

FOREIGN PATENT DOCUMENTS

CN         1270303        10/2000

(Continued)

OTHER PUBLICATIONS

*Office action* from the Chinese Patent Office issued in Applicant's corresponding Chinese Patent Application No. 200610066028.0 dated Jul. 4, 2008.

(Continued)

*Primary Examiner*—Jayprakash N Gandhi
*Assistant Examiner*—Courtney L Smith
(74) *Attorney, Agent, or Firm*—Robert E. Bushnell, Esq.

(57) ABSTRACT

A plasma display module including a plasma display panel adapted to display an image with gas discharge, a chassis adapted to support the plasma display panel, a driving unit arranged on the chassis and adapted to generate an electrical signal that drives the plasma display panel, an integrated circuit chip arranged on a signal transmitting unit, the integrated circuit chip being adapted to control electrical signal transfer between the driving unit and the plasma display panel, a cover plate arranged on the signal transmitting unit and adapted to cover the integrated circuit chip and a wave-type heat dissipating plate arranged on the cover plate.

19 Claims, 3 Drawing Sheets

U.S. PATENT DOCUMENTS

| | | | |
|---|---|---|---|
| 7,182,124 B2* | 2/2007 | Chen | 165/80.3 |
| 7,215,549 B2* | 5/2007 | Kim | 361/704 |
| 7,265,984 B2* | 9/2007 | Numata | 361/719 |
| 2004/0164679 A1* | 8/2004 | Hibino et al. | 313/582 |
| 2005/0156013 A1* | 7/2005 | Bhatti et al. | 228/193 |
| 2005/0259401 A1* | 11/2005 | Han et al. | 361/704 |
| 2007/0046205 A1* | 3/2007 | Kwon et al. | 313/582 |

FOREIGN PATENT DOCUMENTS

| | | |
|---|---|---|
| CN | 1571622 | 1/2005 |
| CN | 1951525 | 3/2005 |
| JP | 55-135455 | 3/1980 |
| JP | 60-27448 | 2/1985 |
| JP | 5-21488 | 9/1993 |
| JP | 08-111480 | 4/1996 |
| JP | 2000-242189 | 9/2000 |
| JP | 2001-352022 | 12/2001 |
| JP | 2003-115568 | 4/2003 |
| JP | 2004-179746 | 6/2004 |
| KR | 20-1991-0009270 | 11/1991 |
| KR | 2003-0024413 | 3/2003 |

OTHER PUBLICATIONS

Office action from the Japanese Patent Office issued in Applicant's corresponding Japanese Patent Application No. 2006-046951 dated Jan. 6, 2009.

* cited by examiner

PLASMA DISPLAY MODULE

CLAIM OF PRIORITY

This application makes reference to, incorporates the same herein, and claims all benefits accruing under 35 U.S.C. § 119 from an application for PLASMA DISPLAY MODULE earlier filed in the Korean Intellectual Property Office on 6 Apr. 2005 and there duly assigned Serial No. 10-2005-0028553.

BACKGROUND OF THE INVENTION

1. Field of the Invention

The present invention relates to a plasma display module, and more particularly, to a plasma display module having improved heat dissipating efficiency.

2. Description of the Related Art

A plasma display module is a display module that displays an image using a gas discharge phenomenon. Recently, the plasma display module is attracting much attention because it provides a wide viewing angle, is slim, has a high quality image, has a large area, and so on.

The plasma display panel includes a first panel and a second panel. The plasma display module includes a signal transmitting unit that is disposed on a surface of a chassis opposite to a plasma display panel. Mounted on the signal transmitting unit is an integrated circuit chip that controls electrical signal transfer between the driving unit and the plasma display panel. The driving unit generates an electrical signal that drives the plasma display panel. A cover plate is disposed on the signal transmitting unit to cover the integrated circuit chip.

When the plasma display module is driven, a large amount of heat is generated by the integrated circuit chip mounted on the signal transmitting unit. In order to dissipate this heat, a heat dissipating sheet can be disposed between the integrated circuit chip and the cover plate. A plurality of flat heat dissipating plates are also attached to the cover plate in order to increase a heat dissipating area of the integrated circuit chip.

However, because of limitations in the current extrusion molding technology, the such a flat heat dissipating plate must be fabricated as an extrusion material that is separate from the cover plate and then be attached to the cover plate. Furthermore, the heat dissipating plate is generally fabricated in various sizes according to a shape of the cover plate. Accordingly, the number of processes and the number of components increase while the total production cost of the plasma display module increases.

SUMMARY OF THE INVENTION

It is therefore an object of the present invention to provide an improved plasma display module.

It is also an object of the present invention to provide a plasma display module with an improved heat dissipation structure.

It is further an object of the present invention to provide a plasma display module that is easy to make.

It is still an object of the present invention to provide a plasma display module which can remarkably reduce the number of processes and the number of components and reduce total production cost without deteriorating heat dissipating efficiency by fabricating a wave-type heat dissipating plate integrally attached to a cover plate.

It is also an object of the present invention to provide a plasma display module having a reduced weight by reducing a weight and a size of a heat dissipating plate.

These and other objects can be achieved by a plasma display module that includes a plasma display panel adapted to display an image with gas discharge, a chassis adapted to support the plasma display panel, a driving unit arranged on the chassis and adapted to generate an electrical signal that drives the plasma display panel, an integrated circuit chip arranged on a signal transmitting unit, the integrated circuit chip being adapted to control electrical signal transfer between the driving unit and the plasma display panel, a cover plate arranged on the signal transmitting unit and adapted to cover the integrated circuit chip and a wave-type heat dissipating plate arranged on the cover plate.

At least one protrusion can be arranged on the cover plate, the at least one protrusion can be adapted to allow for coupling to the heat dissipating plate. The heat dissipating plate can be a single integrated unit, the heat dissipating plate being coupled to the cover plate. At least one penetrating aperture can be arranged in the heat dissipating plate, the aperture can be adapted to couple with the at least one protrusion of the cover plate.

The heat dissipating plate is fastened to the cover plate by a process including inserting the at least one protrusion of cover plate into the at least one aperture of the heat dissipating plate and physically pressing a portion of the at least one protrusion that is exposed through the at least one aperture.

The plasma display module can further include a heat dissipating sheet arranged between the integrated circuit chip and the cover plate, the heat dissipating sheet having a high thermal conductivity. The plasma display module can further include a thermal grease arranged between the chassis and the integrated circuit chip. The cover plate can be aluminum. The heat dissipating plate can be aluminum. The signal transmitting unit can be a tape carrier package (TCP).

According to another aspect of the present invention, there is provided a plasma display module that includes a plasma display panel adapted to display an image, a chassis arranged on a rear surface of the plasma display panel and being adapted to support the plasma display panel, a driving unit arranged on the chassis and adapted to generate an electrical signal that drives the plasma display panel, a signal transmitting unit arranged on the chassis and adapted to transmit the electrical signal generated at the driving unit to the plasma display panel, an integrated circuit chip arranged on a signal transmitting unit, the integrated circuit chip being adapted to control the electrical signal transmission between the driving unit and the plasma display panel, a cover plate arranged on the signal transmitting unit and adapted to cover the integrated circuit chip and a wave-type heat dissipating plate arranged on the cover plate and adapted to dissipate heat generated by the integrated circuit chip to ambient air.

The chassis can include at least one reinforcement member arranged along an edge of the chassis and adapted to prevent the chassis and the plasma display panel from bending, the signal transmission unit can be arranged on one of the at lease one reinforcement member. The wave-type heat dissipating plate can have a large surface contact area with ambient air. The wave-type heat dissipating plate can have a plurality of waves, each wave having a triangular cross section. The wave-type heat dissipating plate can be perforated by a plurality of apertures, the cover plate can include a plurality of protrusions that correspond to the plurality of apertures in the wave-type heat dissipating plate. The wave-type heat dissipating plate can be fastened to the cover plate by insertion of said plurality of protrusions into said plurality of apertures. The wave-type heat dissipating plate can be integral with the cover plate. The wave-type heat dissipating plate can be a single integrated unit and can cover an entirety of the cover plate. The wave-type heat dissipating plate can have an accordion-like shape.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
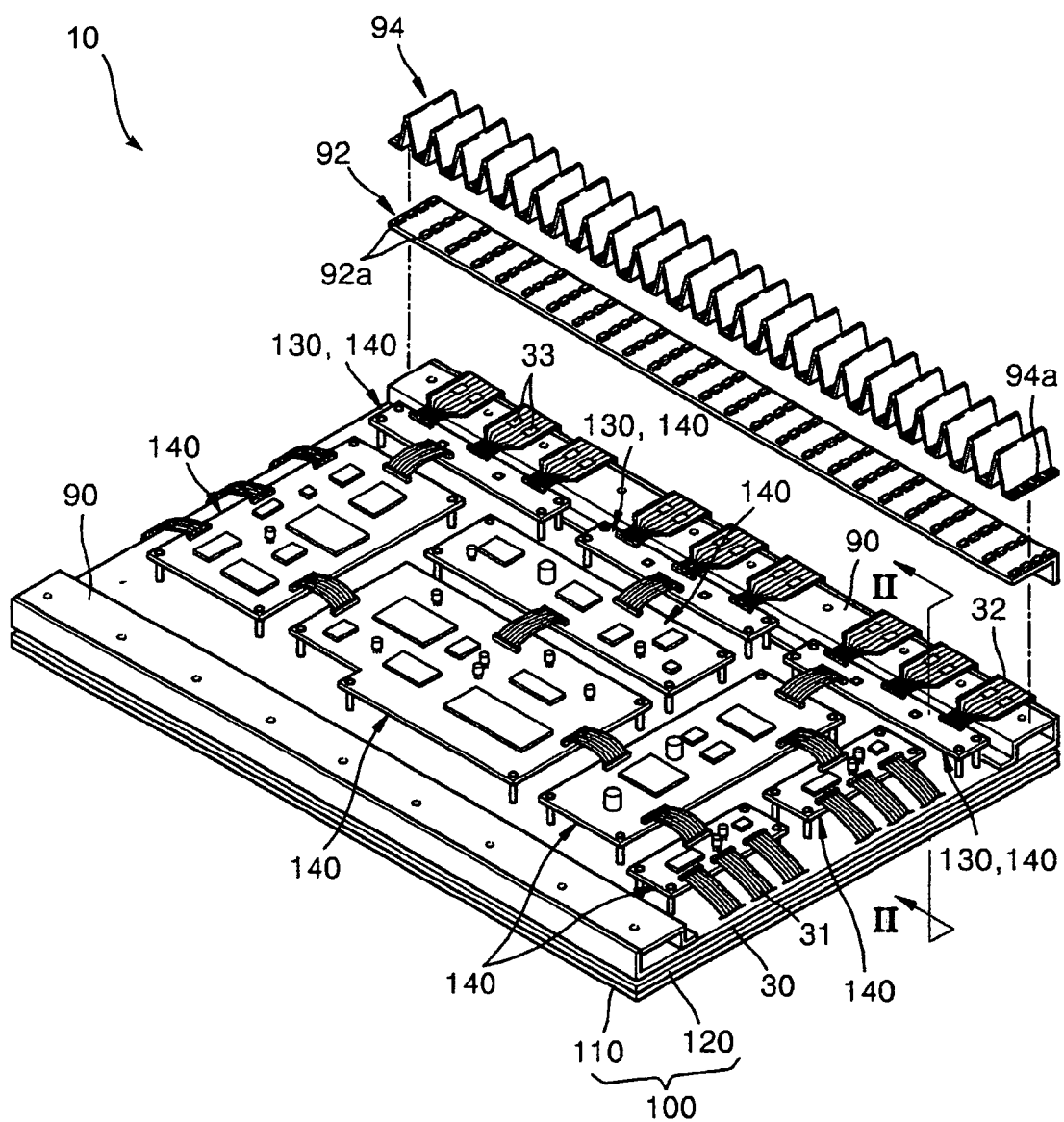
FIG. 1 is a partial exploded perspective view of a plasma display module according to an embodiment of the present invention.
Figure 2:
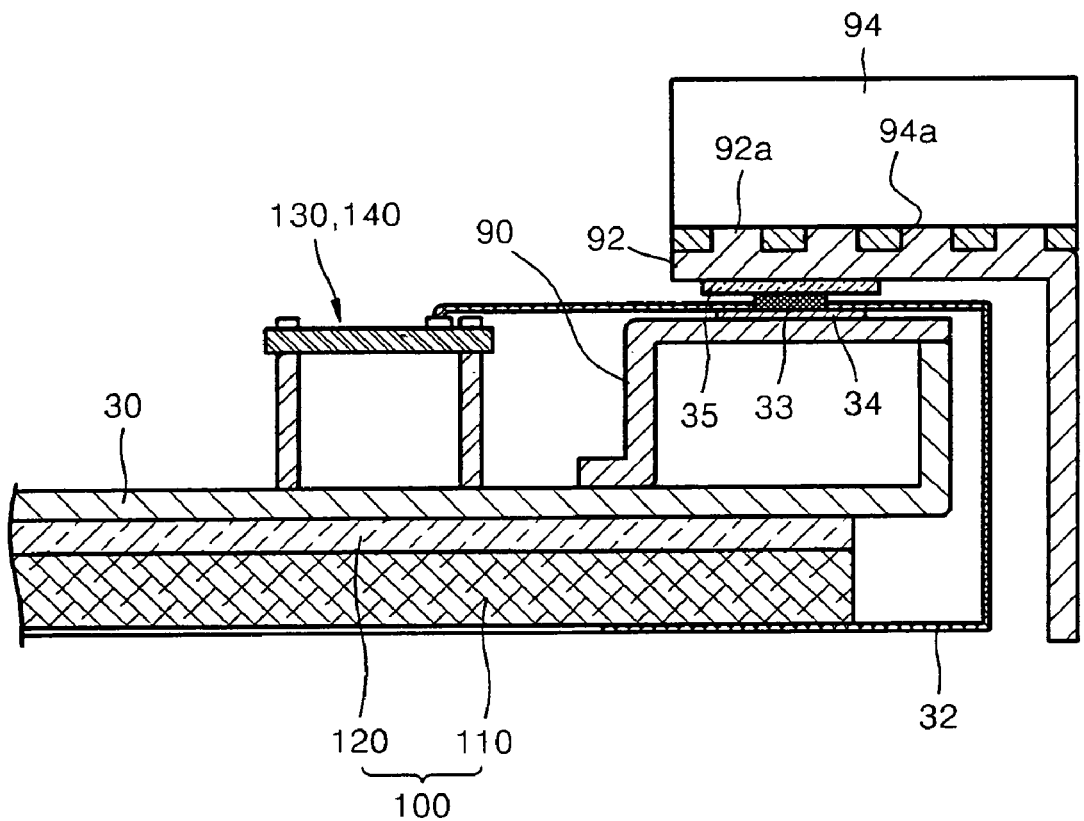
FIG. 2 is a partial cross-sectional view of the plasma display module of FIG. 1 taken along line II-II of FIG. 1.
Figure 3:
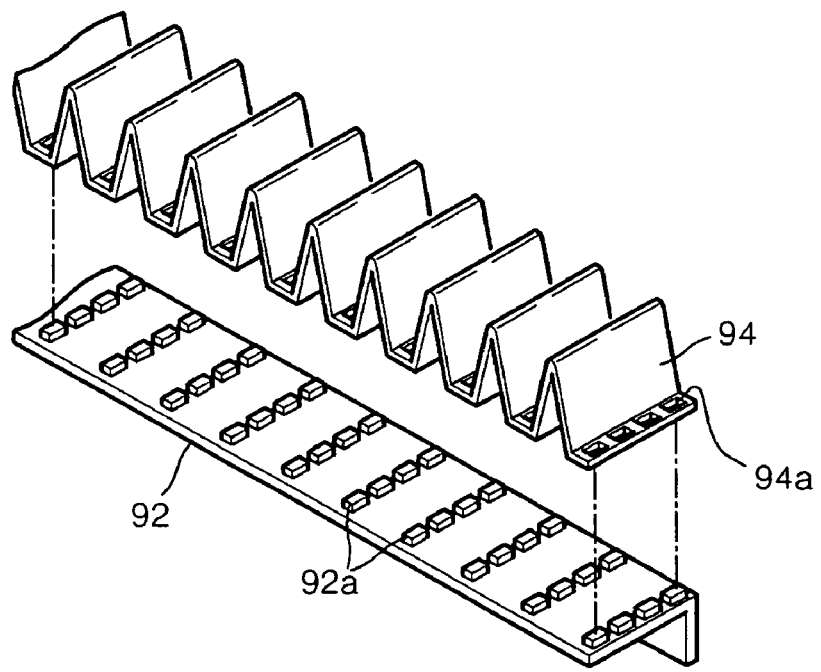
FIG. 3 is a partial exploded perspective view of a cover plate and a heat dissipating plate which are included in the plasma display module of FIG. 1.
Figure 4:
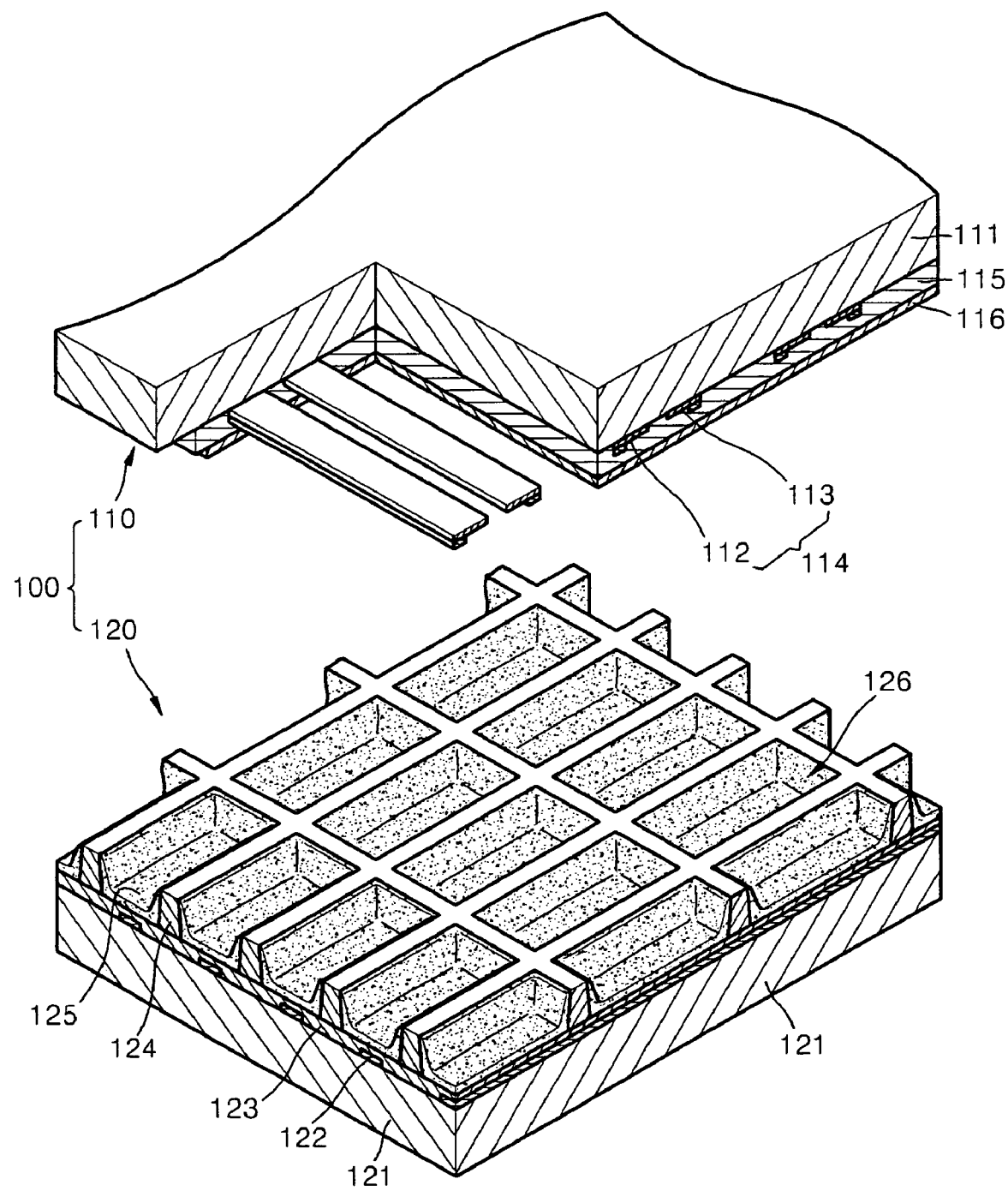
FIG. 4 is a partial exploded perspective view of the plasma display panel of the plasma display module of FIG. 1.

Turning now to the figures, FIG. 1 is a partial exploded perspective view of a plasma display module 10 according to an embodiment of the present invention, FIG. 2 is a partial cross-sectional view of the plasma display module 10 taken along line II-II of FIG. 1, FIG. 3 is a partial exploded perspective view of a cover plate 92 and a heat dissipating plate 94 of the plasma display module 10 of FIG. 1, and FIG. 4 is a partial exploded perspective view of a plasma display panel 100 of the plasma display module 10 of FIG. 1. Referring the figures, a plasma display module 10 according the present embodiment includes a plasma display panel 100. For the present invention, any one of various kinds of plasma display panels can be employed. For example, a three-electrode AC surface discharge plasma display panel can be employed.

Turning now to FIG. 4, FIG. 4 illustrates the case where the plasma display panel 100 of FIG. 1 is a three-electrode AC surface discharge plasma display panel. In FIG. 4, the plasma display panel 100 includes a first panel 110 and a second panel 120. As shown in FIG. 4, the first panel 110 includes a plurality pairs of sustain electrodes 114 including X-electrodes 113 and Y-electrodes 112 which are disposed on a first substrate 111 in a stripe shape, a first dielectric layer 115 covering the sustain electrode pairs 114, and a protective layer 116 covering the first dielectric layer 115.

Also illustrated in FIG. 4 is the second panel 120 that includes a plurality of address electrodes 122 arranged on a second substrate 121 and extending in a direction perpendicular to the sustain electrode pairs 114, a second dielectric layer 123 covering the address electrodes 122, partition walls 124 formed on the second dielectric layer 123 and defining discharge cells 126. The partition walls 124 serve to prevent crosstalk between neighboring discharge cells 126. Within the discharge cells 126 are phosphor layers 125 of red, green, and blue coated on the partition walls 124 and a discharge gas filling the discharge cells 126.

The address electrodes 122 traverse the discharge cells 126 and extend to an edge of the substrates 111, 112. The address electrodes 122 serve to generate an address discharge in the discharge cells 126 which selects the discharge cells 126 for a subsequent sustain discharge. Each discharge cell 126 is situated between a sustain electrode pair 114 and an address electrodes 122.

A chassis 30 is disposed on a surface of the plasma display panel 100 having the above structure. The chassis 30 dissipates heat generated by the plasma display panel 100 thus preventing the temperature of the plasma display panel 100 from rising above a predetermined level. Chassis 30 also serves to prevent the plasma display panel 100 from being deformed by heat or by external impact.

As described above, since the chassis 30 supports the plasma display panel 100 and prevents the plasma display panel 100 from being deformed or damaged, the chassis 30 must have sufficient rigidity. In order to reinforce the rigidity, the plasma display module 10 can include a reinforcement member 90 that is disposed on a surface of the chassis 30 opposite to the plasma display panel 100 to reinforce the rigidity of the chassis 30.

A driving unit 140 is mounted on the surface of the chassis 30 opposite to the plasma display panel 100. The driving unit 140 includes an address electrode driving unit 130 that generates an electrical signal for driving the address electrodes 122. The driving unit 140 also includes various electronic components (not shown) and supplies a voltage signal and power necessary for displaying an image on the plasma display panel 100.

The driving unit 140 is electrically connected to the plasma display panel 100 through the signal transmitting units 31 and 32. The signal transmitting units 31 and 32 can be a flexible printed cable (FPC), a tape carrier package (TCP) or a chip on film (COF). The signal transmitting units 31 and 32 are arranged in a line on the chassis 30 or on the reinforcement member 90 along an edge of an upper side and/or a lower side of the chassis 30. One end of each signal transmitting unit 31 and 32 is connected to the plasma display panel 100 through a lower end of the chassis 30 and the other end thereof is connected to the driving unit 140.

Preferably, the signal transmitting unit 32 is mounted on the reinforcement member 90. An integrated circuit chip 33, for controlling electrical signal transfer between the address electrode 122 and the address electrode driving unit 130, is mounted on the signal transmitting unit 32. With this arrangement, heat generated by the plasma display panel 100 is prevented from being directly transferred to the integrated circuit chip 33 through the chassis 30. In other words, heat generated in the plasma display panel 100 is transferred to a surface of the reinforcement member 90 which has an increased contact area with the ambient air. Accordingly, heat dissipation of the integrated circuit chip 33 can be improved.

In order to smoothly dissipate the heat generated by the integrated circuit chip 33 to an opposite side of the reinforcement member 90 through the reinforcement member 90 and prevent the integrated circuit chip 33 to be damaged, the integrated circuit chip 33 is covered by a cover plate 92. Here, the cover plate 92 can be made out of aluminum, but the present invention is in no way so limited as any material having a superior thermal conductivity can be used in the cover plate 92. At least one protrusion 92a can be formed on the cover plate 92. A heat dissipating plate 94 is attached to the cover plate 92 by inserting the protrusion 92a of the cover plate 92 into at least one penetrating aperture 94a perforating the heat dissipating plate 94. Although the cover plate 92 is illustrated as having an L-shape, in no way is the present invention so limited as the cover plate can have other shapes, such as a straight-line shape.

A heat dissipating sheet 35, having a high thermal conductivity and made out of a polymer, can be further interposed between the integrated circuit chip 33 and the cover plate 92. By including this heat dissipating sheet 35, when the cover plate 92, which is made of relatively rigid aluminum alloy (having Brinell hardness of 100 or more), directly contacts the integrated circuit chip 33, the integrated circuit chip 33 is prevented from being damaged by mechanical pressure that occurs during a fastening process using a bolt. A thermal grease 34 can be further be interposed between the reinforcement member 90 and the integrated circuit chip 33. By including the thermal grease 34 and the heat dissipating sheet 35, the integrated circuit chip 33 can be prevented from directly contacting the reinforcement member 90.

The plasma display module 10 according to the present invention also includes at least one wave-type heat dissipating plate 94 mounted on the cover plate 92. The wave-type heat dissipating plate 94 serves to promote heat dissipation from the integrated circuit chip 33. By including the wave-type heat dissipating plate 94, the heat generated and transferred from the integrated circuit chip 33 to the cover plate 92 can be efficiently transferred to the outside through the heat dissipating plate 94 as the wave-type heat dissipating plate 94 has a wide heat dissipation area. The heat dissipating plate 94 can be made out of aluminum, however the present invention is in no way so limited as any material having a superior thermal conductivity can be used.

Although the cross section of the waves in the heat dissipating plate 94 in FIG. 4 are illustrated as having a triangular cross section, the present invention is in no way so limited as the waves of the heat dissipating plate 94 can instead have an arched, a rectangular, or a pentagonal cross section. In the present invention, it is preferable that the heat dissipating plate 94 be as thin as possible within an allowable limit of the extrusion molding technology, however, the heat dissipating plate 94 should be made thick enough so that there is sufficient thickness to provide for enough durability to maintain its original shape. Further, it is preferable that the portion of the heat dissipating plate 94 attached to the cover plate 92 is flat so there will be enough space for coupling the cover plate 92 to the heat dissipating plate 94.

At least one penetrating aperture 94a is preferably formed in a portion of the heat dissipating plate 94 attached to the cover plate 92. Since the protrusion 92a formed on the cover plate 92 is inserted into the penetrating aperture 94a, it is preferable that the number of the penetrating apertures 94a is equal to the number of protrusions 92a.

The heat dissipating plate 94 is preferably fastened to the cover plate 92 via a boss caulking technique, but the present invention is in no way so limited. The boss caulking technique involves inserting the protrusion 92a formed on the cover plate 92 into the penetrating aperture 94a formed in the heat dissipating plate 94 and physically pressing a portion of the protrusion 92a that is exposed through the penetrating aperture 94a to attach the heat dissipating plate 94 to the cover plate 92. Alternatively, the heat dissipating plate 94 can be fastened to the cover plate 92 using various other techniques, such as by an adhesive or by screw coupling.

The heat dissipating plate 94 can be formed as a single integrated monolithic unit that covers the entire cover plate 92. However, the present invention is in no way so limited as the heat dissipating plate 94 can be divided into two or more portions and still be within the scope of the present invention. One advantage by having the heat dissipating plate 94 being of a single unit covering all of the cover plate 92 is such a heat dissipating plate is more easy to make and is thus less expensive because such a heat dissipating plate 94 can be fabricated with less process steps as only one extrusion molding machine is needed and the number of process steps is reduced as the separate parts of the heat dissipation plate do not have to be assembled together. This is because an individual mold is not required for each shape and thus the number of the components is reduced. Also, in the present embodiment, since only one heat dissipating plate 94, that is, one mold for making the heat dissipating plate is required in the plasma display module 10, it is possible to reduce a size and a weight of the heat dissipating plate 94. This is caused by the following reason. In order to perform extrusion molding, a mold having a predetermined size must be fabricated. Accordingly, if the number of the molds increases, a weight and a size of the mold increases. By the aforementioned heat dissipating plate 94, the number of the processes for fabricating the plasma display module 10 and the number of the components can be minimized and thus it is possible to reduce a weight of the plasma display module 10. Thus, total production cost of the plasma display module 10 can be reduced.

According to the present invention, it is possible to provide the plasma display module that can remarkably reduce the number of the processes and the number of the components and reduce total production cost without deteriorating heat dissipating efficiency by fabricating the wave-type heat dissipating plate integrally attached to the cover plate. According to the present invention, it is possible to provide a plasma display module having a reduced total weight by reducing the size and the weight of the heat dissipating plate.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A plasma display module, comprising:
a plasma display panel to display an image with gas discharge;
a chassis arranged on a rear side of the plasma display panel to support the plasma display panel and to dissipate heat generated by the plasma display panel;
a reinforcement member located on the chassis and running along an edge of the chassis base to reinforce a rigidity of the plasma display panel and to further dissipate beat generated by the plasma display panel;
a driving unit located on the chassis and to generate an electrical signal that drives the plasma display panel;
a signal transmitting unit electrically connecting the driving unit to the plasma display panel, the signal transmitting unit being flexible;
an integrated circuit chip located on the signal transmitting unit, the integrated circuit chip to control electrical signal transfer between the driving unit and the plasma display panel;
a cover plate located on the signal transmitting unit and to cover the integrated circuit chip, the cover plate being on an opposite side of the integrated circuit chip than the reinforcement member, the cover plate to dissipate heat generated by the integrated circuit chip to a side of the integrated circuit chip opposite to that of the reinforcement member; and
a wave-type heat dissipating plate located on the cover plate to promote heat dissipation from the integrated circuit chip by having a wide heat dissipation area.

2. The plasma display module of claim 1, wherein at least one protrusion is located on the cover plate, the at least one protrusion to allow for coupling to the heat dissipating plate.

3. The plasma display module of claim 1, wherein the heat dissipating plate is a single integrated unit, the heat dissipating plate being coupled to the cover plate.

4. The plasma display module of claim 2, wherein at least one penetrating aperture is arranged in the heat dissipating plate, the aperture to couple with the at least one protrusion of the cover plate.

5. The plasma display module of claim 4, wherein the heat dissipating plate is fastened to the cover plate by a process comprising:
   inserting the at least one protrusion of cover plate into the at least one aperture of the heat dissipating plate; and
   physically pressing a portion of the at least one protrusion that is exposed through the at least one aperture.

6. The plasma display module of claim 1, further comprising a heat dissipating sheet arranged between the integrated circuit chip and the cover plate, the heat dissipating sheet having a high thermal conductivity.

7. The plasma display module of claim 1, wherein the signal transmitting unit comprises a tape carrier package (TCP).

8. A plasma display module, comprising:
   a plasma display panel to display an image;
   a chassis located on a rear surface of the plasma display panel to support the plasma display panel and to dissipate heat generated by the plasma display panel;
   a driving unit located on the chassis to generate an electrical signal that drives the plasma display panel;
   a signal transmitting unit located on the chassis and to transmit the electrical signal generated at the driving unit to the plasma display panel;
   an integrated circuit chip located on a signal transmitting unit, the integrated circuit chip to control the electrical signal transmission between the driving unit and the plasma display panel;
   a cover plate located on an opposite side of the integrated circuit chip than the chassis base to draw heat dissipated by the integrated circuit chip away from the integrated circuit chip in a direction away from the plasma display panel and away from the chassis; and
   a wave-type heat dissipating plate located on the cover plate the wave-type dissipating sheet having a wide heat dissipating area and being located on an opposite side of the integrated circuit chip than the plasma display panel to efficiently transfer heat generated by the integrated circuit chip to ambient air.

9. The plasma display module of claim 8, the chassis comprising at least one reinforcement member arranged along an edge of the chassis to prevent the chassis and the plasma display panel from bending, the signal transmitting unit located on one of the at least one reinforcement member.

10. The plasma display module of claim 8, the wave-type heat dissipating plate having a plurality of waves, each wave having a triangular cross section.

11. The plasma display module of claim 8, the wave-type heat dissipating plate being perforated by a plurality of apertures, the cover plate comprising a plurality of protrusions that correspond to the plurality of apertures in the wave-type heat dissipating plate.

12. The plasma display module of claim 11, the wave-type heat dissipating plate being fastened to the cover plate by insertion of said plurality of protrusions into said plurality of apertures.

13. The plasma display module of claim 8, the wave-type heal. dissipating plate being integral with the cover plate.

14. The plasma display module of claim 8, the wave-type heat dissipating plate being a single integrated unit and covering an entirety of the cover plate.

15. The plasma display module of claim 8, the wave-type heat dissipating plate having an accordion-like shape.

16. The plasma display module of claim 1, the plasma display panel is located on a front side of the chassis, the driving unit, the integrated circuit chip, the cover plate and the wave-type heat dissipating plate are located on a rear and opposite side of the chassis.

17. The plasma display module of claim 8, the plasma display panel is located on a front side of the chassis, the driving unit, the integrated circuit chip, the cover plate and the wave-type heat dissipating plate are located on a rear and opposite side of the chassis.

18. The plasma display module of claim 16, the cover plate and the wave-type heat dissipating plate being further from the chassis than the integrated circuit chip.

19. The plasma display module of claim 16, the chassis being arranged directly on the plasma display panel.

* * * * *